(12) United States Patent
Kim et al.

(10) Patent No.: US 9,919,666 B2
(45) Date of Patent: Mar. 20, 2018

(54) METHOD FOR DIAGNOSING LEAKAGE OF ELECTRIC PARTS AND SERVICING GUIDE OF DRIVING STATE FOR VEHICLE IN BATTERY MANAGEMENT SYSTEM

(71) Applicant: Hyundai Motor Company, Seoul (KR)

(72) Inventors: Mi Ok Kim, Gyeonggi-do (KR); Jong Hu Yoon, Jeollanam-do (KR); Beom Gyu Kim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 320 days.

(21) Appl. No.: 14/821,745

(22) Filed: Aug. 9, 2015

(65) Prior Publication Data
US 2016/0163127 A1 Jun. 9, 2016

(30) Foreign Application Priority Data
Dec. 8, 2014 (KR) ........................ 10-2014-0175091

(51) Int. Cl.
*B60R 16/033* (2006.01)
*G01R 31/02* (2006.01)
*H02H 3/14* (2006.01)
*H02J 7/14* (2006.01)
(Continued)

(52) U.S. Cl.
CPC .......... *B60R 16/033* (2013.01); *G01R 31/025* (2013.01); *H02H 3/14* (2013.01);
(Continued)

(58) Field of Classification Search
CPC .... B60L 3/0046; B60L 3/0053; B60L 3/0069; B60L 3/12; B60L 11/1881; B60L 11/1803; B60L 15/20; B60L 2240/421; B60L 2240/547; B60L 2240/80; B60L 2250/10; B60L 2250/16; B60L 2270/145;
(Continued)

(56) References Cited

U.S. PATENT DOCUMENTS

| 8,264,234 B2 * | 9/2012 | Yano | ...................... B60L 3/0046 324/509 |
| 2009/0002903 A1 * | 1/2009 | Uchida | ...................... B60L 3/00 361/49 |

(Continued)

FOREIGN PATENT DOCUMENTS

| JP | H06321031 A | 11/1994 |
| JP | 2008-289313 A | 11/2008 |

(Continued)

*Primary Examiner* — Thomas G Black
*Assistant Examiner* — Ce Li Li
(74) *Attorney, Agent, or Firm* — Mintz Levin Cohn Ferris Glovsky and Popeo, P.C.; Peter F. Corless

(57) ABSTRACT

A method for diagnosing leakage of electronic parts and servicing guide of a driving state for a vehicle in a battery management system is provided. The method includes normally driving the vehicle or stopping the vehicle by cutting off a relay based on whether electronic parts broken due to insulation resistance breakdown are required for the driving of the vehicle. In addition, the method includes services a guide required for each broken electronic part about a driving state of the vehicle, by stepwise measuring insulation resistance of vehicle key on, engine starting, an operation of load parts such as a driving motor in the vehicle, an air conditioner, and a low-voltage DC-DC converter, and the like.

16 Claims, 6 Drawing Sheets

(51) Int. Cl.
*G01R 27/02* (2006.01)
*G01R 31/00* (2006.01)

(52) U.S. Cl.
CPC .......... *G01R 27/025* (2013.01); *G01R 31/007* (2013.01); *H02J 7/1461* (2013.01)

(58) Field of Classification Search
CPC .. G01R 31/025; G01R 31/007; G01R 27/025; G01R 27/18; Y02T 10/7005; Y02T 10/7275; Y02T 10/645; Y02T 10/72; Y02T 90/34; G07C 5/06; G07C 5/12
See application file for complete search history.

(56) References Cited

U.S. PATENT DOCUMENTS

| | | | |
|---|---|---|---|
| 2009/0134881 A1* | 5/2009 | Tachizaki | B60L 3/0023 324/551 |
| 2010/0244850 A1* | 9/2010 | Yano | B60L 3/0046 324/510 |
| 2012/0274131 A1* | 11/2012 | Makino | B60L 3/0069 307/9.1 |
| 2013/0245869 A1* | 9/2013 | Nishida | B60L 3/0069 701/22 |
| 2014/0039740 A1* | 2/2014 | Kwon | G06F 17/00 701/22 |

FOREIGN PATENT DOCUMENTS

| | | |
|---|---|---|
| KR | 10-0792942 B | 1/2008 |
| KR | 10-2009-0012456 A | 2/2009 |
| KR | 10-2010-0004024 A | 1/2010 |
| KR | 20100004024 A * | 1/2010 |
| KR | 10-2013-0042136 A | 4/2013 |
| KR | 20130042136 A * | 4/2013 |
| KR | 10-2014-0017783 A | 2/2014 |

* cited by examiner

| POSITION OF INSULATION RESISTANCE BREAKDOWN | DETERMINATION POSSIBLE TIMING | TIME CONSTANT OF INSULATION RESISTANCE SENSING VALUE | CONTROL DRIVING OF VEHICLE |
|---|---|---|---|
| HIGH VOLTAGE BATTERY | IG ON | SMALL (Cb) | NO DRIVING |
| HIGH VOLTAGE DC CABLE AND HIGH VOLTAGE DC LINK TERMINAL | READY (START) VEHICLE | MIDDLE (Cb+Ci+Ca+Cl) | NO DRIVING |
| DRIVING MOTOR AND 3-PHASE CABLE | READY VEHICLE AND DRIVE MOTOR | LARGE (Cb+Ci+Ca+Cl+Cm) | DRIVE VEHICLE ONLY BY ENGINE |
| HSG MOTOR AND 3-PHASE CABLE | READY VEHICLE AND DRIVE MOTOR | LARGE (Cb+Ci+Ca+Cl+Ch) | NO BATTERY CHARGING BY REGENERATIVE BRAKING, NORMALLY DRIVE EXCEPT FOR THAT |
| AIR CONDITIONER COMPRESSOR AND 3-PHASE CABLE | READY VEHICLE AND DRIVE A/C | LARGE (Cb+Ci+Ca+Cl+Cc) | NO AIR CONDITIONER OPERATION, NORMAL DRIVING EXCEPT FOR THAT |
| OBC | AT THE TIME OF SLOW CHARGING | LARGE (Cb+Ci+Ca+Cl+Co) | NO SLOW CHARGING, NORMAL DRIVING EXCEPT FOR THAT |

FIG.6

METHOD FOR DIAGNOSING LEAKAGE OF ELECTRIC PARTS AND SERVICING GUIDE OF DRIVING STATE FOR VEHICLE IN BATTERY MANAGEMENT SYSTEM

CROSS-REFERENCE TO RELATED APPLICATION

This application is based on and claims the benefit of priority to Korean Patent Application No. 10-2014-0175091, filed on Dec. 28, 2014 in the Korean Intellectual Property Office, the disclosure of which is incorporated herein in its entirety by reference.

TECHNICAL FIELD

The present disclosure relates to a method for diagnosing leakage of electronic parts and servicing guide of a driving state for a vehicle in a battery management system, and more particularly, to a method for diagnosing leakage of electronic parts and servicing guide of a vehicle driving state in a battery management system capable of normally driving the vehicle or stopping the vehicle by cutting off a relay, based on whether electronic parts broken due to insulation resistance breakdown while the driving of the vehicle are required for the driving of the vehicle, and servicing a guide required for each broken electronic part.

BACKGROUND

A battery management system (BMS) of a vehicle which monitors failure of a vehicle battery system may be configured to cut off a battery relay and stop to assure safety of the system. For example, when electricity leaks to a vehicle chassis due to leakage or deterioration of a battery, a short circuit of a cable, an insulation resistance breakdown in high voltage systems or electronic parts in the vehicle, etc., there is a need to alert a driver of the vehicle state and to stop the vehicle to assure safety against an electronic shock to passengers. The insulation resistance of about 500 Ω/V or greater is required legally and for a 200 V battery, the insulation resistance should be maintained at about 100 kΩ or greater. Therefore, there is a need to maintain insulation resistance at about 300 kΩ or greater in consideration of a margin or inhibit the driving of the vehicle at the insulation resistance less than that.

However, the existing battery management system only determines the insulation resistance breakdown without determining positions of electronic parts broken due to insulation resistance breakdown while driving the vehicle to cut off the battery relay, and therefore may not determine which one of the electronic parts fails. Further, when the vehicle receives after service, a service center measures the insulation resistance thereof while forcibly operating high voltage parts, and the like, one by one to determine the broken electronic parts. Additionally, since the cause of the failure may be difficult to determine after a substantial amount of time, incorrect service may be performed thus potentially leading to failure of other components.

SUMMARY

The present disclosure provides a method for diagnosing leakage of electronic parts and servicing guide of a driving state for a vehicle in a battery management system capable of normally driving the vehicle or stopping the vehicle by cutting off a relay, based on whether electronic parts broken due to insulation resistance breakdown are required for driving the vehicle, and servicing a guide required for each broken electronic part, by stepwise measuring insulation resistance of vehicle key on, engine starting, an operation of load parts such as a driving motor in the vehicle, an air conditioner, and a low-voltage direct current-direct current (DC-DC) converter (LDC), and the like.

According to an exemplary embodiment of the present disclosure, a method for diagnosing leakage of electronic parts and servicing guide of a driving state for a vehicle in a battery management system, may include: measuring insulation resistance between a cathode or an anode of a battery and a chassis of a vehicle for each state in a vehicle state including a state after and before the vehicle is driven and diagnosing failure of the electronic parts associated with the corresponding vehicle state by referring to a reference time constant table in the corresponding vehicle state stored in a memory for a time constant that corresponds to the measured insulation resistance; and determining whether the corresponding broken electronic parts are required for driving the vehicle based on a failure occurrence to turn off each relay connected to the cathode and the anode of the battery in response to determining that the vehicle is not driven and to permit the connection of the relay in response to determining that the vehicle is driven to generate a diagnostic result message for the corresponding broken electronic parts and output the generated diagnostic result message through a display device in the vehicle.

The reference time constant table may include a reference time constant value for at least any one vehicle state of an enable state before starting the vehicle in which an ignition key is inserted into the vehicle to apply power to control devices for the vehicle; a vehicle ready state in which a vehicle starts up to apply the power to at least one high voltage part and a low-voltage DC-DC converter (LDC) via a high voltage DC cable; and a state in which a driving load supplied with the power through a 3-phase cable connected to any one of the at least one high voltage part is turned on, in addition to the vehicle ready state.

The driving load may include at least any one of a driving motor, a hybrid starter generator (HSG) motor, and an air conditioner compressor. The reference time constant table may further include a reference time constant value for a state in which at least any other one driving load connected to the battery is connected, in addition to the vehicle ready state. The other driving load may include an on-board charger (OBC) configured to charge the battery.

The diagnosis may include a case in which the time constant that corresponds to the insulation resistance measured for the cathode or the anode of the battery is less than the corresponding reference time constant of the table, in the enable state before starting the vehicle in which the ignition key is inserted into the vehicle to apply power to the control devices for the vehicle and the determination may include no driving determination for the failure occurrence of the battery corresponding to the case.

In addition, the diagnosis may include a case in which the time constant that corresponds to the insulation resistance measured for the cathode or the anode of the battery before the relay is connected is less than the corresponding reference time constant of the table, in the vehicle ready state in which the vehicle starts up to apply the power to at least one high voltage part and the low-voltage DC-DC converter (LDC) via the high voltage DC cable by the connection of the relay; and the determination may include no driving determination for the failure occurrence of the high voltage DC cable or the high voltage parts linked therewith or the LDC corresponding to the case.

The diagnosis may further include a case in which the time constant that corresponds to the insulation resistance measured for the cathode or the anode of the battery is less than the corresponding reference time constant of the table, in the state in which the vehicle starts up and the driving load supplied with the power through a 3-phase cable connected to any one of at least one high voltage part, the low-voltage DC-DC converter (LDC), and the at least one high voltage part via the high voltage DC cable by the connection of the relay is turned on; and the determination may include a driving possible determination for the failure occurrence of the corresponding driving load corresponding to the case.

In the diagnosis, when the time constant that corresponds to the insulation resistance measured for the cathode or the anode of the battery is less than the corresponding reference time constant, in the connection state of any other driving loads connected to the battery in addition to the vehicle ready state, the determination may include a driving possible determination for the failure occurrence of the other driving loads corresponding to the case.

According to another exemplary embodiment of the present disclosure, a battery management system (BMS) for a vehicle for diagnosing and guiding an insulation failure, may include: a memory configured to store capacitance and a reference time constant table for each vehicle state including a state after and before driving a vehicle; a vehicle information receiver configured to receive information regarding the vehicle state from a controller area network (CAN); a measurer configured to measure insulation resistance between a cathode or an anode of a battery and a chassis of the vehicle for each vehicle state; a controller configured to diagnose a failure of electronic parts associated with the corresponding vehicle state by referring to the reference time constant table for a time constant that corresponds to the measured insulation resistance calculated using the capacitance, and determine whether the corresponding broken electronic parts are required for driving the vehicle based on the failure occurrence to turn off each relay connected to the cathode and the anode of the battery in response to determining that the vehicle is not driven, and permit the connection of the relay in response to determining that the vehicle is driven, and a display information provider configured to generate a diagnostic result message for the corresponding broken electronic parts and output the generated diagnostic result message through a display device in the vehicle. The controller may be configured to operate the other components of the BMS.

The reference time constant table may include a reference time constant value for at least any one vehicle state of an enable state before starting the vehicle in which an ignition key is inserted into the vehicle to apply power to control devices for the vehicle; a vehicle ready state in which a vehicle starts up to apply the power to at least one high voltage part and a low-voltage DC-DC converter (LDC) via a high voltage DC cable; and a turning on state of a driving load supplied with the power through a 3-phase cable connected to any one of the at least high voltage part, in addition to the vehicle ready state.

The driving load may include at least any one of a driving motor, a hybrid starter generator (HSG) motor, and an air conditioner compressor. Additionally, the reference time constant table may further include a reference time constant value for a state in which at least any other one driving load connected to the battery is connected, in addition to the vehicle ready state. The other driving load may include an on-board charger (OBC) configured to charge the battery.

The controller may be configured to perform no driving determination for the failure occurrence of the battery that corresponds to when the time constant corresponding to the insulation resistance measured for the cathode or the anode of the battery before the relay is connected is less than the corresponding reference time constant of the table, in the enable state before starting the vehicle in which the ignition key is inserted into the vehicle to apply power to the control devices for the vehicle.

The controller may further be configured to perform no driving determination for the failure occurrence of the high voltage DC cable, the high voltage part linked therewith, or the LDC that corresponds to when the time constant corresponding to the insulation resistance measured for the cathode or the anode of the battery is less than the corresponding reference time constant of the table, in the vehicle ready state in which the vehicle starts up to apply the power to at least one high voltage part and the low-voltage DC-DC converter (LDC) via the high voltage DC cable by the connection of the relay.

Additionally, the controller may be configured to perform the driving possible determination for the failure occurrence of the corresponding driving load that corresponds to when the time constant corresponding to the insulation resistance measured for the cathode or the anode of the battery is less than the corresponding reference time constant of the table, in the state in which the vehicle starts up and the driving load supplied with the power through a 3-phase cable connected to any one of at least one high voltage part, the low-voltage DC-DC converter (LDC), and the at least one high voltage part via the high voltage DC cable by the connection of the relay is turned on.

The controller may also be configured to perform the driving possible determination for the failure occurrence of the other driving loads that corresponds to when the time constant corresponding to the insulation resistance measured for the cathode or the anode of the battery is less than the corresponding reference time constant, in the connection state of any other driving loads connected to the battery in addition to the vehicle ready state.

BRIEF DESCRIPTION OF THE DRAWINGS

The above and other objects, features and advantages of the present disclosure will be more apparent from the following detailed description taken in conjunction with the accompanying drawings.

FIG. 6 is a table showing diagnostic timing for each step of a vehicle state and a processing example based on failure occurrence, according to an exemplary embodiment of the present disclosure.

DETAILED DESCRIPTION

Figure 1:
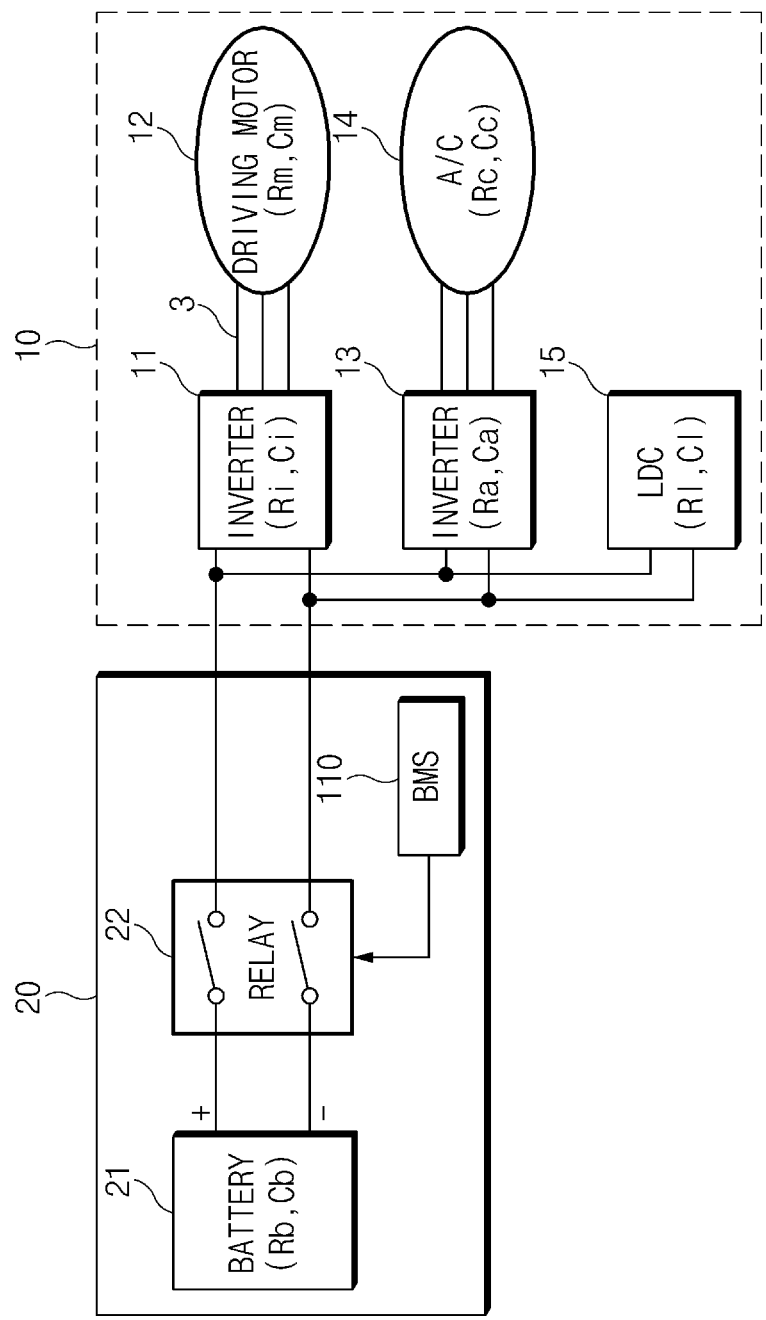
FIG. 1 is a diagram describing a battery management system for a vehicle according to an exemplary embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electronic vehicles, combustion, plug-in hybrid electronic vehicles, hydrogen-powered vehicles and other alternative fuel vehicles (e.g. fuels derived from resources other than petroleum).

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

Furthermore, control logic of the present invention may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, the present disclosure will be described in detail with reference to the accompanying drawings. Throughout the accompanying drawings, the same components will be denoted by the same reference numerals. In addition, a detail description for functions and/or configurations that have been well-known will be omitted. In the following specification, portions required for understanding operations according to various exemplary embodiments will be mainly described, and a description for components that may obscure the gist of the present disclosure will be omitted. In addition, some components in the accompanying drawings may be exaggerated, omitted, or schematically shown. Sizes of the respective components do not reflect actual sizes of the respective components. Therefore, contents mentioned herein are not limited by relative sizes of or intervals between components shown in the accompanying drawings.

FIG. 1 is a diagram for describing a battery management system 110 for a vehicle according to an exemplary embodiment of the present disclosure. Referring to FIG. 1, in a battery system 20 configured to supply power to inverters 11 and 13 which are high voltage parts, a driving motor 12 or an air conditioner 14 connected thereto via a 3-phase cable, and a load 10 including the electronic parts within a vehicle such as a low-voltage DC-DC converter (LDC) 15 and to manage the power, a battery management system 110 for a vehicle according to an exemplary embodiment of the present disclosure may be configured to collect various status information regarding vehicles from various sensors or a controller area network (CAN) to monitor failure occurrence due to insulation resistance breakdown, and the like to normally operate the battery system 20 (e.g., without failure), open and close a high voltage relay 22, and appropriately guide positions of broken electronic parts (e.g., more accurately detect the positions of the broken parts).

The battery system 20 may include the battery management system (BMS) 110 and a battery 21 configured to supply power to various loads 10 in addition to the battery management system, in which a cathode and an anode of the battery 21 may be connected to or disconnected (e.g., turned off) from two terminals of the load 10 via each of the high voltage relays 22 depending on a control of the battery management system 110. In particular, FIG. 1 illustrates several parts which may be included in the load 10, but the present disclosure is not limited thereto, the load 10 may further include various driving loads such as a hybrid starter generator (HSG) motor supplied with power via a 3-phase cable connected to the inverter which is another high voltage part and configured to support starting, a full automatic temperature control system (FATC), a positive temperature coefficient (PTC) heater, and an on-board charger (OBC) connected to the battery 21 via the relay 22 to support charging of the battery 21.

The battery management system 110 may be configured to use various sensing signals from various sensor or the controller area network (CAN) to sense insulation resistance between a cathode or an anode of the battery 21 and a vehicle chassis and may be configured to turn off the high voltage relay 22 based on a failure during a short circuit of other loads or other abnormal occurrence.

In particular, according to the exemplary embodiment of the present disclosure, it may be possible to first drive a vehicle when electronic parts which are broken due to the insulation resistance breakdown are not required for driving the vehicle (e.g., the vehicle may be driven without the use of such electronic components which have failed) but perform actions thereon later, by stepwise measuring insulation resistance breakdown of vehicle key on (IG On), engine starting, an operation of load parts such as the driving motor 12 within the vehicle, the air conditioner 14, and the low-voltage DC-DC converter (LDC) 15, and the like and as will be described below, it may be possible to more easily implement a system using a time constant table to determine whether the insulation resistance breakdown occurs. Further, it may be possible to more easily perform maintenance without a risk of mis-maintenance or over-maintenance by providing a notification regarding whether the electronic parts are broken when the problem occurs for the post-maintenance, by servicing the guide required for the broken electronic parts regarding the insulation resistance breakdown.

Figure 2:
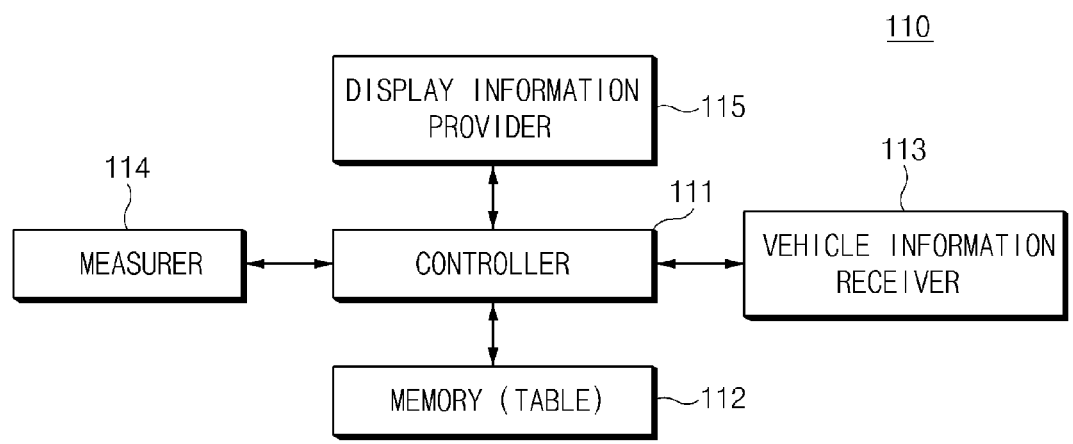
FIG. 2 is a detailed block diagram of the battery management system for a vehicle according to the exemplary embodiment of the present disclosure.

FIG. 2 is a detailed block diagram of the battery management system 110 for a vehicle according to the exemplary embodiment of the present disclosure. Referring to FIG. 2, the battery management system 110 for a vehicle according to the exemplary embodiment of the present disclosure may include a controller 111, a memory 112, a vehicle information receiver 113, a measurer 114, and a display information provider 115. Each component of the battery management system 110 for a vehicle may be implemented by hardware, software, a combination thereof. The controller 111 may be a semiconductor processor configured to operate each component of the battery management system 110 and may also be implemented to perform functions, including at least any other one of each component.

First, a function of each component of the battery management system 110 for a vehicle will be described. The memory 112 may be configured to store a reference time constant table generated by tuning each state for each vehicle step including a state after and before the driving of the vehicle in advance. Further, the memory 112 may also be configured to store capacitance for each state of the vehicle.

In each state of the vehicle, for a normal state (e.g., a state without failure) in which there is no insulation resistance breakdown of each step detected by previous measurement, the reference time constant table may be stored in the memory 112. The time constant corresponds to a value obtained by multiplying the insulation resistance by the capacitance. Additionally, the vehicle information receiver 113 may be configured to receive information regarding each vehicle state for each step of the vehicle including the state after and before the vehicle is driven from a controller area network (CAN) through which required information such as sensing information or control information may be transmitted and received between control devices (or apparatuses) within the vehicle.

Figure 3:
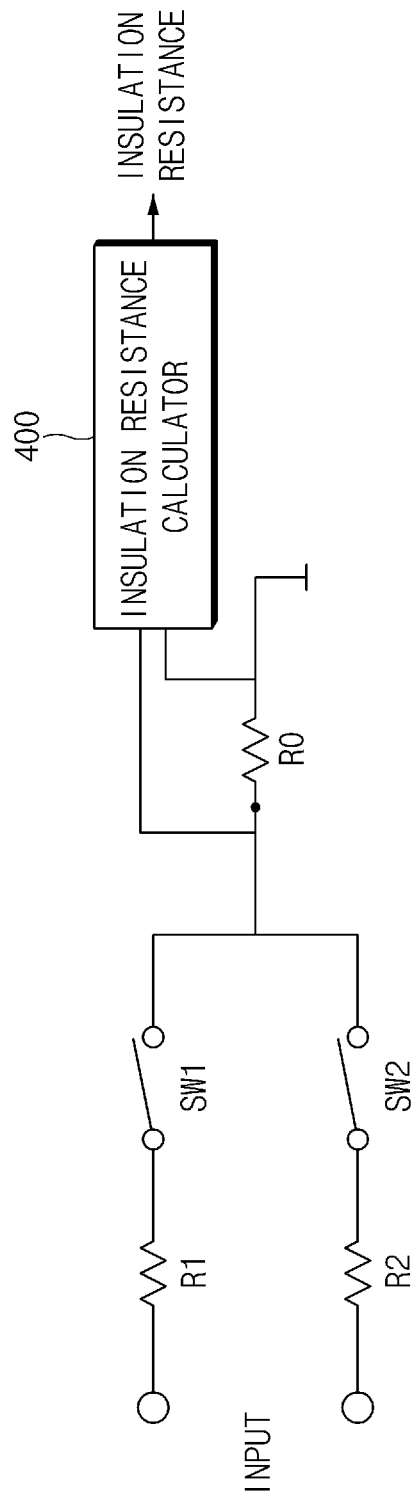
FIG. 3 is an exemplary a circuit diagram of a measurer of FIG. 2 according to the exemplary embodiment of the present disclosure.

The measurer 114 may be configured to measure insulation resistance between a cathode or an anode of the battery 21 and a vehicle chassis for each step of the vehicle state as described above. For example, as the measurer 114, a circuit as illustrated in FIG. 3 may be used. In other words, in FIG. 3, after a first switch SW1 is closed and a second switch SW2 is opened, an insulation resistance calculator 400 may be configured to receive the insulation resistance between the cathode of the battery 21 and the chassis and a voltage divided to Ro among voltages divided to R1 and Ro to calculate and output the corresponding insulation resistance.

Similarly, in FIG. 3, after the first switch SW1 is opened and the second switch SW2 is closed, the insulation resistance calculator 400 may be configured to receive the insulation resistance between the anode of the battery 21 and the chassis and the voltage divided to the Ro among voltages divided to R2 and Ro to calculate and output the corresponding insulation resistance. The measurer 114 may be configured to use any one of the insulation resistances for the cathode or the anode of the battery 21 or use an average value thereof.

The controller 111 may be configured to calculate the corresponding time constant using the capacitance for the corresponding vehicle state of the memory 112 with respect to the corresponding insulation resistance measured by the measurer 114, diagnose the failure of electronic parts associated with the corresponding vehicle state by referring to the reference time constant table of the memory 112 for the time constant that corresponds to the measured insulation resistance, and determine whether the corresponding broken electronic parts are required for driving the vehicle based on the corresponding failure occurrence in the case of the failure as the result of the diagnostic result to turn off each relay 22 connected to the cathode and the anode of the battery 21 in response to determining that the vehicle cannot be driven (e.g., the failed electronic part is required to drive the vehicle), and permit the connection of the relay 22 in response to determining that the vehicle may be driven (e.g., the failed electronic part is not required to drive the vehicle).

The display information provider 115 may be configured to generate a diagnostic result message for the corresponding broken electronic parts based on the above failure occurrence and provide the generated diagnostic result message to a display device within the vehicle. For example, as the diagnostic result message, an appropriate message (e.g., position alarm, alarm of a necessity of corresponding part off, and the like) for the failure occurrence of the battery 21, the high voltage direct current (DC) cable 2, the LDC 15, the high voltage parts 11 and 13, and the driving motor, the air conditioner compressor 14, an HSG motor (not illustrated), or an OBC (not illustrated) connected via the 3-phase cable 3, and the like may be provided to the display device within the vehicle. Various forms such as a cluster of an instrument panel, a navigation terminal, or a telematics terminal, and paired user mobile terminals may be used for the display device within the vehicle.

Figure 4:
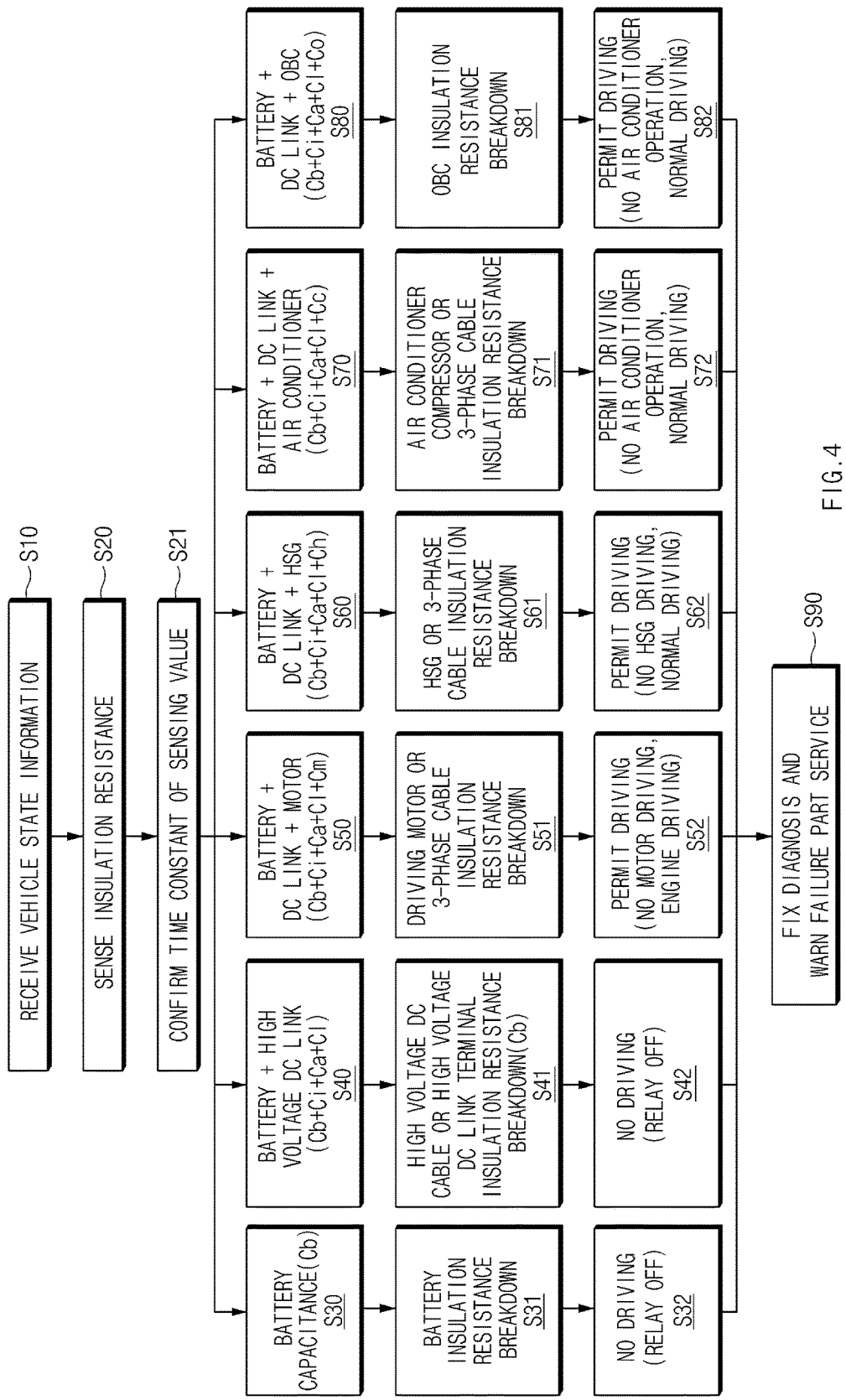
FIG. 4 is a flow chart describing an operation of the battery management system for a vehicle according to the exemplary embodiment of the present disclosure.

Hereinafter, referring to a flow chart of FIG. 4, an operation of the battery management system 110 for a vehicle according to the exemplary embodiment of the present disclosure will be described in more detail. First, the vehicle information receiver 113 may be configured to receive information regarding each vehicle state for each step of the vehicle including the state after and before the vehicle is driven from the controller area network (CAN) through which required information such as sensing information or control information may be transmitted and received between the control devices (or apparatuses) within the vehicle (S10).

In particular, the measurer 114 may be configured to measure the insulation resistance between the cathode or the anode of the battery 21 and the vehicle chassis for the corresponding vehicle state based on the information regarding the vehicle state received by the vehicle information receiver 113. The controller 111 may then be configured to calculate the corresponding time constant using the capacitance for the corresponding vehicle state of the memory 112 with respect to the corresponding insulation resistance measured by the measurer 114 and extract the time constant for the corresponding vehicle state from the reference time constant table of the memory 112 to diagnose whether the electronic parts associated with the corresponding vehicle state fails (S21).

Referring to FIG. 6, the reference time constant table of the memory 112 may include a reference time constant value (e.g., corresponding to insulation resistance Rb between battery-chassis and corresponding capacitance Cb) in an enable state before starting the vehicle in which an ignition key is inserted into a vehicle to apply power from the battery 21 to operate devices (e.g., ECU, etc.) for the vehicle, a reference time constant value (e.g., corresponding to insulation resistance (Rb‖Ri‖Ra‖Rl‖) and capacitance (Cb+Ci+Ca+Cl) in the corresponding state) in a vehicle ready state in which a vehicle starts up to apply the power from the battery 21 to at least one high voltage part (e.g., inverters 11 and 13, etc.) and the low-voltage DC-DC converter (LDC) 15 via the high voltage DC cable 2, a reference time constant value (e.g., corresponding to insulation resistance (Rb‖Ri‖Ra‖Rl‖Ro) and capacitance (Cb+Ci+Ca+Cl+Co) in the corresponding state) in a connection state of at least any other one driving load (e.g., OBC) connected to the battery in addition to the vehicle ready state, a reference time constant value (e.g., corresponding to insulation resistance (Rb‖Ri‖Ra‖Rl‖Rk) and capacitance (Cb+Ci+Ca+Cl+Ck)) in a state in which the driving loads (e.g., driving motor 12 and HSG motor (not illustrated), or air conditioner compressor 14, etc.) supplied with power via the 3-phase cable 3 connected to any one of the at least one high voltage parts (e.g., inverters 11 and 13, etc.) are turned on, and the like, in addition to the vehicle ready state.

Figure 5:
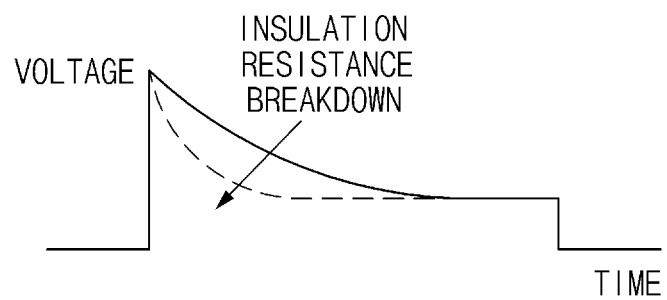
FIG. 5 is a diagram describing a change in time constant at the time of insulation resistance breakdown according to an exemplary embodiment of the present disclosure.

Particularly, when the driving motor 12 is turned on, Rk=Rm and Ck=Cm. Further, when the HSG motor (not illustrated) is turned on, Rk=Rh and Ck=Ch. When the air conditioner compressor 14 is turned on, Rk=Rc and Ck=Cc. First, when the time constant value (e.g., corresponding to insulation resistance Rb between battery-chassis and corresponding capacitance Cb) in the enable state before starting the vehicle in which the ignition key is inserted into the vehicle to apply power to the control devices (for example, ECU, etc.) for the vehicle among the above vehicle states is extracted from the reference time constant table of the memory 112 (S30), when the time constant that corresponds to the measured insulation resistance for the cathode or the anode of the battery 21 before the relay 22 is connected is less than the corresponding reference time constant of the reference time constant table of the memory 112 (see FIG. 5) (S31), the controller may be configured to determine a breakdown (e.g., failure) of the insulation resistance in the battery 21 and may accordingly be configured to turn off each relay 22 connected to the cathode and the anode of the battery 21 by performing the no driving determination (S32). I In addition, the display information provider 115 may be configured to generate the corresponding diagnostic result message (e.g., "the position of the insulation resistance breakdown is the battery. Please repair the insulation state associated with the battery", etc.) based on the failure occurrence of the battery 21 and provide the generated diagnostic result message through the display devices within the vehicle such as a cluster of an instrument panel and a navigation terminal (S90).

Further, when a reference time constant value (e.g., corresponding to insulation resistance (Rb‖Ri‖Ra‖Rl) and capacitance (Cb+Ci+Ca+Cl) in the corresponding state) in a vehicle ready state in which a vehicle starts up to apply the power from the battery 21 to at least one high voltage part (e.g., inverters 11 and 13, etc.) and the low-voltage DC-DC converter 15 via the high voltage DC cable 2 is extracted from the reference time constant table of the memory 112 (S40), when the time constant that corresponds to the insulation resistance measured for the cathode or the anode of the corresponding battery 21 in the connection state of the relay 22 is less than the corresponding reference time constant of the reference time constant table of the memory 112 (see FIG. 5), the controller 111 may be configured to determine that the insulation resistance breakdown occurs in the high voltage DC cable 2, the high voltage parts (e.g., inverters 11 and 13, etc.) linked therewith, or the LDC 15 (S41) and turn off each relay 22 connected to the cathode and the anode of the battery 21 by performing the no driving determination (S42).

In particular, the display information provider 115 may be configured to generate the corresponding diagnostic result message (e.g., "the position of the insulation resistance breakdown is the high voltage DC cable or the link terminal thereof. Please repair the insulation state associated with the high voltage DC cable or the link terminal thereof", etc.) based on the failure occurrence of the high voltage DC cable 2, the high voltage parts (e.g., inverters 11 and 13, etc.) linked therewith, or the LDC 15 and provide the generated diagnostic result message through the display devices within the vehicle such as the cluster of the instrument panel and the navigation terminal (S90).

Additionally, the controller 111 may be configured to extract the reference time constant value (e.g., corresponding to insulation resistance (Rb‖Ri‖Ra‖Rl‖Rk) and capacitance (Cb+Ci+Ca+Cl+Ck) in the corresponding state) in a state in which the driving loads (e.g., driving motor 12 and HSG motor (not illustrated), or air conditioner compressor 14, etc.) supplied with power via the 3-phase cable 3 connected to any one of the at least one high voltage parts (e.g., inverters 11 and 13, etc.) in addition to the vehicle ready state (power applying state of at least one high voltage part, the LDC, and the like via the high voltage DC cable by the connection of the relay 22) from the reference time constant table of the memory 112 (S50/S60/S70). When the driving motor 12 is turned on, Rk=Rm and Ck=Cm. Further, when the HSG motor (not illustrated) is turned on, Rk=Rh and Ck=Ch. When the air conditioner compressor 14 is turned on, Rk=Rc and Ck=Cc.

Particularly, when the time constant that corresponds to the insulation resistance measured for the cathode or the anode of the battery 21 in the corresponding state is less than the corresponding reference time constant of the reference time constant table of the memory 112 (see FIG. 5), the controller 111 may be configured to determine that the insulation resistance breakdown occurs in the corresponding driving loads such as the driving motor 12, the HSG motor (not illustrated), and the air conditioner compressor 14 (S51/S61/S71) and in this case, since the vehicle may still be driven, perform a driving possible determination to permit the connection of the relay 22 for the corresponding failure occurrence (S52/S62/S72).

Furthermore, the display information provider 115 may be configured to generate the corresponding diagnostic result message (e.g., "the position of the insulation resistance breakdown is the driving motor. The vehicle may be driven only by the engine and please repair the insulation state of the driving motor", etc.) based on the failure occurrence of the driving motor 12 and provide the generated diagnostic result message to the display devices within the vehicle such as the cluster of the instrument panel and the navigation terminal (S90).

The display information provider 115 may also be configured to generate the corresponding diagnostic result message (e.g., "the position of the insulation resistance breakdown is the HSG motor. The vehicle may be normally driven (e.g., driven without failure) but the battery may not be charged during regenerative braking, and therefore, please repair the insulation state of the HSG.") based on the failure occurrence of the HSG motor (not illustrated) and provide the generated diagnostic result message to the display devices within the vehicle such as the cluster of the instrument panel and the navigation terminal (S90).

Further, the display information provider 115 may be configured to generate the corresponding diagnostic result message (e.g., "the position of the insulation resistance breakdown is the air conditioner compressor. The vehicle may be normally driven but the operation of the air conditioner may not be performed, and therefore, please repair the insulation state of the air conditioner compressor.") based on the failure occurrence of the air conditioner compressor 14 and provide the generated diagnostic result message to the display devices within the vehicle such as the cluster of the instrument panel and the navigation terminal (S90).

In addition, when the reference time constant value (e.g., corresponding to insulation resistance (Rb‖Ri‖Ra‖Rl‖Ro) and capacitance (Cb+Ci+Ca+Cl+Co) in the corresponding state) in a connection state of at least one another driving load (for example, OBC) connected to the battery 21 in addition to the vehicle ready state (power applying state of at least one high voltage part, the LDC, and the like via the high voltage DC cable due to the connection of the relay 22) is extracted from the reference time constant table of the memory 112 (S80), when the time constant corresponding to the measured insulation resistance for the cathode or the anode of the battery 21 in the corresponding state is less than the corresponding reference time constant of the reference time constant table of the memory 112 (see FIG. 5), the controller 111 may be configured to determine that the insulation resistance breakdown occurs in the driving load such as the OBC (not illustrated) (S81) and since the vehicle may still be driven, the controller 111 may be configured to perform the driving possible determination to permit the connection of the relay 22 for the corresponding failure occurrence (S82).

In particular, the display information provider 115 may be configured to generate the corresponding diagnostic result message (e.g., "the position of the insulation resistance breakdown is the OBC. The vehicle may be driven but the slow charging cannot be performed, and therefore please repair the OBC insulation state.") based on the failure occurrence of the driving load such as the OBC (not illustrated) and provide the generated diagnostic result message to the display devices within the vehicle such as the cluster of the instrument panel and the navigation terminal (S90).

As described above, according to a method for diagnosing leakage of electronic parts and servicing guide of a driving state for a vehicle in a battery management system 110 according to the exemplary embodiments of the present disclosure, it may be possible to provide improved convenience to first drive the vehicle when the electronic parts broken due to the insulation resistance breakdown are not required for driving the vehicle but perform actions thereon later (e.g., service the parts at a later point in time since the vehicle may be driven without the use of such broken components), by stepwise measuring the insulation resistance breakdown of the vehicle key on (IG On), the engine starting, the operation of the load parts such as the driving motor in the vehicle, the air conditioner, and the low-voltage DC-DC converter (LDC), and the like.

Further, it may be possible to more easily implement the system using the time constant table to determine whether the insulation resistance breakdown occurs. Maintenance may be more easily performed without a risk of mis-maintenance or over-maintenance by more accurately determining whether electronic parts are broken when the problem occurs for the post-maintenance, by servicing the guide required for the broken electronic parts about the insulation resistance breakdown.

Hereinabove, although the present disclosure has been described by specific matters such as detailed components, and the like, exemplary embodiments, and the accompanying drawings, they have been provided only for assisting in the entire understanding of the present disclosure. Therefore, the present disclosure is not limited to the above-mentioned exemplary embodiments, but may be variously modified and altered by those skilled in the art to which the present disclosure pertains without departing from the spirit and scope of the present disclosure. Therefore, the present disclosure is not to be limited to the above-mentioned exemplary embodiments. That is, the following claims as well as all contents modified equally or equivalently to the claims are to fall within the scopes and spirits of the disclosure.

What is claimed is:

1. A method for diagnosing leakage of electronic parts and servicing guide of a driving state for a vehicle in a battery management system, comprising:
   measuring, by a controller, insulation resistance between a cathode or an anode of a battery and a vehicle chassis for each vehicle state including a state after and before driving of the vehicle;
   storing, by the controller, capacitance and a reference time constant table for each vehicle state including the state after and before driving of the vehicle;
   diagnosing, by the controller, whether the electronic parts associated with the corresponding vehicle state fail by referring to a reference time constant table in the corresponding vehicle state stored in a memory for a time constant that corresponds to the measured insulation resistance; and
   determining, by the controller, whether the corresponding broken electronic parts are required for the driving of the vehicle based on a failure occurrence to turn off each relay connected to the cathode and the anode of the battery in response to determining that the vehicle is not driven and to permit a connection of the relay in response to determining that the vehicle is driven to generate a diagnostic result message for the corresponding broken electronic parts and output the generated diagnostic result message through a display device within the vehicle,
   wherein the diagnosis includes determining, by the controller, that the time constant corresponding to the insulation resistance measured for the cathode or the anode of the battery is less than the corresponding reference time constant of the table, in a state in which the vehicle starts up and a driving load supplied with power through a 3-phase cable connected to any one of at least one high voltage part, a low-voltage DC-DC converter (LDC), and the at least one high voltage part via a high voltage DC cable by the connection of the relay is turned on; and the determination includes determining, by the controller, a driving possible state for the failure occurrence of the corresponding driving load corresponding to the case.

2. The method according to claim 1, wherein the reference time constant table includes a reference time constant value for at least any one vehicle state selected from the group consisting of:
   an enable state before starting the vehicle in which an ignition key is inserted into the vehicle to apply power to vehicle control devices,
   the vehicle ready state in which a vehicle starts up to apply the power to at least one high voltage part and a low-voltage DC-DC converter (LDC) via a high voltage DC cable; and a state in which a driving load supplied with the power through a 3-phase cable connected to any one of the at least one high voltage part is turned on, in addition to the vehicle ready state.

3. The method according to claim 2, wherein the driving load includes at least any one selected from the group consisting of: a driving motor, a hybrid starter generator (HSG) motor, and an air conditioner compressor.

4. The method according to claim 2, wherein the reference time constant table further includes a reference time constant value for a state in which at least any other one driving load connected to the battery is connected, in addition to the vehicle ready state.

5. The method according to claim 4, wherein the other driving load includes an on-board charger (OBC) configured to charge the battery.

6. The method according to claim 1, wherein the diagnosis includes determining, by the controller, that the time constant corresponding to the insulation resistance measured for the cathode or the anode of the battery before the relay is connected is less than the corresponding reference time constant of the table, in an enable state before starting the vehicle, and the determination includes determining, by the controller, no driving for the failure occurrence of the battery corresponding to the case.

7. The method according to claim 1, wherein the diagnosis includes determining, by the controller, that the time constant corresponding to the insulation resistance measured for the cathode or the anode of the battery is less than the corresponding reference time constant of the table, in a vehicle ready state; and the determination includes determining, by the controller, no driving for the failure occurrence of the high voltage DC cable or the high voltage parts linked therewith or the LDC corresponding to the case.

8. The method according to claim 7, wherein in the diagnosis, when the time constant corresponding to the insulation resistance measured for the cathode or the anode of the battery is less than the corresponding reference time constant, in a connection state of any other driving loads connected to the battery in addition to a vehicle ready state, the determination includes determining, by the controller, a driving possible state for the failure occurrence of the other driving loads corresponding to the case.

9. A battery management system for a vehicle for diagnosing and guiding an insulation failure, comprising:
a memory configured to store capacitance and a reference time constant table for each vehicle state including a state after and before driving of the vehicle;
a vehicle information receiver configured to receive information regarding the vehicle state from a controller area network (CAN);
a measurer configured to measure insulation resistance between a cathode or an anode of a battery and a vehicle chassis for vehicle state;
a controller configured to diagnose a failure of electronic parts associated with the corresponding vehicle state by referring to the reference time constant table for a time constant corresponding to the measured insulation resistance calculated using the capacitance, and determine whether the corresponding broken electronic parts are required for driving the vehicle based on a failure occurrence to turn off each relay connected to the cathode and the anode of the battery in response to determining that the vehicle is not driven, and permit a connection of the relay in response to determining that the vehicle is driven, and a display information provider configured to generate a diagnostic result message for the corresponding broken electronic parts and output the generated diagnostic result message through a display device within the vehicle,
wherein the controller is configured to determine a driving possible state for the failure occurrence of a corresponding driving load corresponding to when the time constant corresponding to the insulation resistance measured for the cathode or the anode of the battery is less than the corresponding reference time constant of the table, in the state in which the vehicle starts up and the driving load supplied with the power through a 3-phase cable connected to any one of at least one high voltage part, a low-voltage DC-DC converter (LDC), and the at least one high voltage part via a high voltage DC cable by the connection of the relay is turned on.

10. The battery management system according to claim 9, wherein the reference time constant table includes a reference time constant value for at least any one vehicle state selected from the group consisting of:
an enable state before starting the vehicle in which an ignition key is inserted into the vehicle to apply power to vehicle control devices;
a vehicle ready state in which the vehicle starts up to apply the power to at least one high voltage part and a low-voltage DC-DC converter (LDC) via a high voltage DC cable; and
a state in which a driving load supplied with the power through a 3-phase cable connected to any one of the at least high voltage part, in addition to the vehicle ready state is turned on.

11. The battery management system according to claim 10, wherein the driving load includes at least any one selected from the group consisting of: a driving motor, a hybrid starter generator (HSG) motor, and an air conditioner compressor.

12. The battery management system according to claim 10, wherein the reference time constant table further includes a reference time constant value for a state in which at least any other one driving load connected to the battery is connected, in addition to the vehicle ready state.

13. The battery management system according to claim 12, wherein the other driving load includes an on-board charger (OBC) configured to charge the battery.

14. The battery management system according to claim 9, wherein the controller is configured to determine a no driving state for the failure occurrence of the battery corresponding to when the time constant corresponding to the insulation resistance measured for the cathode or the anode of the battery before the relay is connected is less than the corresponding reference time constant of the table, in an enable state.

15. The battery management system according to claim 9, wherein the controller is configured to determine a no driving state for a failure occurrence of a high voltage DC cable, a high voltage part linked therewith, or an LDC corresponding to when the time constant corresponding to the insulation resistance measured for the cathode or the anode of the battery is less than the corresponding reference time constant of the table, in a vehicle ready state.

16. The battery management system according to claim 15, wherein the controller is configured to determine a driving possible state for a failure occurrence of the other driving loads corresponding to a case in which the time constant corresponding to the insulation resistance measured for the cathode or the anode of the battery is less than the corresponding reference time constant, in a connection state of any other driving loads connected to the battery in addition to a vehicle ready state.

* * * * *